(12) United States Patent
Jones et al.

(10) Patent No.: US 9,389,973 B2
(45) Date of Patent: Jul. 12, 2016

(54) MEMORY ERROR PROPAGATION FOR FASTER ERROR RECOVERY

(71) Applicant: Oracle International Corporation, Redwood Shores, CA (US)

(72) Inventors: Blake Alan Jones, Oakland, CA (US); Stephen Chessin, Mountain View, CA (US)

(73) Assignee: Oracle International Corporation, Redwood Shores, CA (US)

( * ) Notice: Subject to any disclaimer, the term of this patent is extended or adjusted under 35 U.S.C. 154(b) by 91 days.

(21) Appl. No.: 14/292,058

(22) Filed: May 30, 2014

(65) Prior Publication Data

US 2015/0347254 A1 Dec. 3, 2015

(51) Int. Cl.
*G06F 11/20* (2006.01)
*G06F 11/07* (2006.01)
*G11C 29/44* (2006.01)
*G11C 29/00* (2006.01)
*G11C 29/04* (2006.01)

(52) U.S. Cl.
CPC .......... *G06F 11/2094* (2013.01); *G06F 11/073* (2013.01); *G11C 29/44* (2013.01); *G11C 29/70* (2013.01); *G06F 11/2089* (2013.01); *G11C 2029/0409* (2013.01); *G11C 2029/4402* (2013.01)

(58) Field of Classification Search
CPC .......... G11C 2029/0411; G11C 29/88; G11C 29/44; G11C 29/70; G06F 11/0793; G06F 11/1666; G06F 11/20; G06F 11/1068; G06F 12/0246; G06F 11/2094; G06F 11/2089; G06F 11/073; G06F 2212/1032; G06F 12/0646

USPC .................................................. 714/6.1, 710
See application file for complete search history.

(56) References Cited

U.S. PATENT DOCUMENTS

| | | | |
|---|---|---|---|
| 7,089,461 B2 | 8/2006 | Gilbert et al. | |
| 7,447,943 B2 | 11/2008 | Vu et al. | |
| 8,055,959 B2 | 11/2011 | Cornwell et al. | |
| 8,261,256 B1 * | 9/2012 | Adler | G06F 1/1626 717/173 |
| 8,291,297 B2 | 10/2012 | Coulson et al. | |
| 8,365,015 B1 | 1/2013 | Yu et al. | |
| 8,392,751 B2 | 3/2013 | Khatri et al. | |
| 8,443,261 B2 | 5/2013 | Waldspurger et al. | |

(Continued)

OTHER PUBLICATIONS

Amin Ansari et al., "ZerehCache: Armoring Cache Architectures in High Defect Density Technologies", Micro, 11 pages, Dec. 12-16, 2009, New York, NY, USA.*

(Continued)

*Primary Examiner* — Cynthia Britt
(74) *Attorney, Agent, or Firm* — Osha Liang LLP

(57) ABSTRACT

A method for managing a corrupted memory block. The method includes detecting the corrupted memory block, and removing, after detecting the corrupted memory block, references to the corrupted memory block. The method further includes identifying, after detecting the corrupted memory block, an uncorrupted memory block and analyzing each cache line. The method further includes determining, while analyzing each cache line, that a first cache line includes an uncorrectable error and creating, based on determining the first cache line includes the uncorrectable error, a second cache line including an artificial error, and migrating the second cache line to the uncorrupted memory block, where a layout of the corrupted memory block is maintained.

18 Claims, 9 Drawing Sheets

(56) References Cited

U.S. PATENT DOCUMENTS

| | | | |
|---|---|---|---|
| 8,478,796 B2 | 7/2013 | Post et al. | |
| 8,601,310 B2 | 12/2013 | Dreier | |
| 2005/0204212 A1* | 9/2005 | Noguchi | G06F 11/1048 714/710 |
| 2009/0204766 A1* | 8/2009 | Jacobi | G06F 12/0804 711/133 |
| 2010/0124133 A1* | 5/2010 | Sarin | G11C 29/848 365/200 |
| 2010/0172179 A1* | 7/2010 | Gorobets | G06F 12/0246 365/185.09 |
| 2010/0268984 A1* | 10/2010 | Guthrie | G06F 11/0724 714/5.11 |
| 2012/0311248 A1* | 12/2012 | Goodman | G06F 12/126 711/105 |
| 2012/0311379 A1* | 12/2012 | Moyer | G06F 11/073 714/6.11 |
| 2013/0191683 A1 | 7/2013 | Gower et al. | |
| 2013/0268739 A1* | 10/2013 | Gupta | G06F 12/16 711/162 |
| 2013/0339785 A1* | 12/2013 | Ambroladze | G06F 11/20 714/6.13 |
| 2015/0143165 A1* | 5/2015 | Cho | G06F 11/1008 714/6.12 |
| 2015/0234702 A1* | 8/2015 | Walton | G06F 11/0793 714/6.13 |
| 2015/0293854 A1* | 10/2015 | Kalamatianos | G06F 12/0873 714/723 |

OTHER PUBLICATIONS

Chris Wilkerson et al., "Trading off Cache Capacity for Reliability to Enable Low Voltage Operation", International Symposium on Computer Architecture, Jun. 2008, 12 pages.*

James Abella et al., "Low Vccmin Fault-Tolerant Cache with Highly Predictable Performance", Micro, 11 pages, Dec. 12-16, 2009, New York, NY, USA.*

"Intel Xeon Processor E7 Family: Reliability, Availability, and Serviceability;" Intel Corporation; 2011 (16 pages) <http://www.intel.com/content/dam/www/public/us/en/documents/white-papers/xeon-e7-family-ras-server-paper.pdf>.

Chander, K. and Khande, A; "Dell Unlocks Key Power Management and Consumed Memory Error Recovery Features with Microsoft Windows Server 2012;" Dell Enterprise Operating System Engineering Team; Oct. 9, 2012 (5 pages) <http://en.community.dell.com/techcenter/os-applications/w/wiki/4148.dell-unlocks-key-power-management-and-consumed-memory-error-recovery-features-with-microsoft-windows-server-2012.aspx>.

"EDAC Testing Injection of Correctable and Uncorrectable Errors;" Atmel Corporation; 2003 (8 pages) <http://aerosupport.atmel.com/Atmel/doc4310.pdf>.

Tang, D., Carruthers, P., Totari, Z., Shapiro, M.W; "Assessment of the Effect of Memory Page Retirement on System RAS Against Hardware Faults;" International Conference on Dependable Systems and Networks; Jun. 2006 (6 pages) <http://ftp.vim.org/pub/NetBSD/misc/cegger/hw_manuals/amd/MPR_DSN06.pdf>.

"Avoiding Server Downtime from Hardware Errors in System Memory with HP Memory Quarantine;" Hewlett-Packard Development Company, L.P.; Jan. 2012 (7 pages) <http://h20565.www2.hp.com/portal/site/hpsc/template.BINARYPORTLET/public/kb/docDisplay/resource.process/?spf_p.tpst=kbDocDisplay_ws_BI&spf_p.rid_kbDocDisplay=docDisplayResURL&javax.portlet.begCacheTok=com.vignette.cachetoken&spf_p.rst_kbDocDisplay=wsrp-resourceState%3DdocId%253Demr_na-c03179047-1%.

* cited by examiner

MEMORY ERROR PROPAGATION FOR FASTER ERROR RECOVERY

BACKGROUND

Modern computer hardware supports the use of memory with built-in error-correcting codes (ECC). These error-correcting codes allow some kinds of errors in the memory hardware to be transparently corrected. Other kinds of errors cannot be corrected, but they can be detected. These errors are known as uncorrectable errors (UEs). The presence of an UE typically degrades performance of a computer system.

SUMMARY

In general, in one aspect, the invention relates to a method for managing a corrupted memory block. The method includes detecting the corrupted memory block comprising a plurality of cache lines, removing, after detecting the corrupted memory block, a plurality of references to the corrupted memory block, identifying, after detecting the corrupted memory block, an uncorrupted memory block, analyzing each cache line of the plurality of cache lines, determining, while analyzing each cache line, a first cache line of the plurality of cache lines comprises an uncorrectable error, creating, based on determining the first cache line comprises the uncorrectable error, a second cache line comprising an artificial error, and migrating the second cache line and each of the plurality of cache lines excluding the first cache line to the uncorrupted memory block, wherein a layout of the corrupted memory block is maintained.

In general, in one aspect, the invention relates to a non-transitory computer readable medium comprising instructions, which when executed by a processor perform a method. The method includes detecting the corrupted memory block comprising a plurality of cache lines, removing, after detecting the corrupted memory block, a plurality of references to the corrupted memory block, identifying, after detecting the corrupted memory block, an uncorrupted memory block, analyzing each cache line of the plurality of cache lines, determining, while analyzing each cache line, a first cache line of the plurality of cache lines comprises an uncorrectable error, creating, based on determining the first cache line comprises the uncorrectable error, a second cache line comprising an artificial error, and migrating the second cache line and each of the plurality of cache lines excluding the first cache line to the uncorrupted memory block, wherein a layout of the corrupted memory block is maintained.

In general, in one aspect, the invention relates to a system for managing a corrupted memory block. The system includes a plurality of memory blocks comprising the corrupted memory block and an uncorrupted memory block, a processor, and a memory error propagator, which when executed by the processor, performs a method. The method includes detecting the corrupted memory block comprising a plurality of cache lines, removing, after detecting the corrupted memory block, a plurality of references to the corrupted memory block, identifying, after detecting the corrupted memory block, the uncorrupted memory block, analyzing each cache line of the plurality of cache lines, determining, while analyzing each cache line, a first cache line of the plurality of cache lines comprises an uncorrectable error, creating, based on determining the first cache line comprises the uncorrectable error, a second cache line comprising an artificial error, and migrating the second cache line and each of the plurality of cache lines excluding the first cache line to the uncorrupted memory block, wherein a layout of the corrupted memory block is maintained.

Other aspects of the invention will be apparent from the following description and the appended claims.

DETAILED DESCRIPTION

Figure 1:
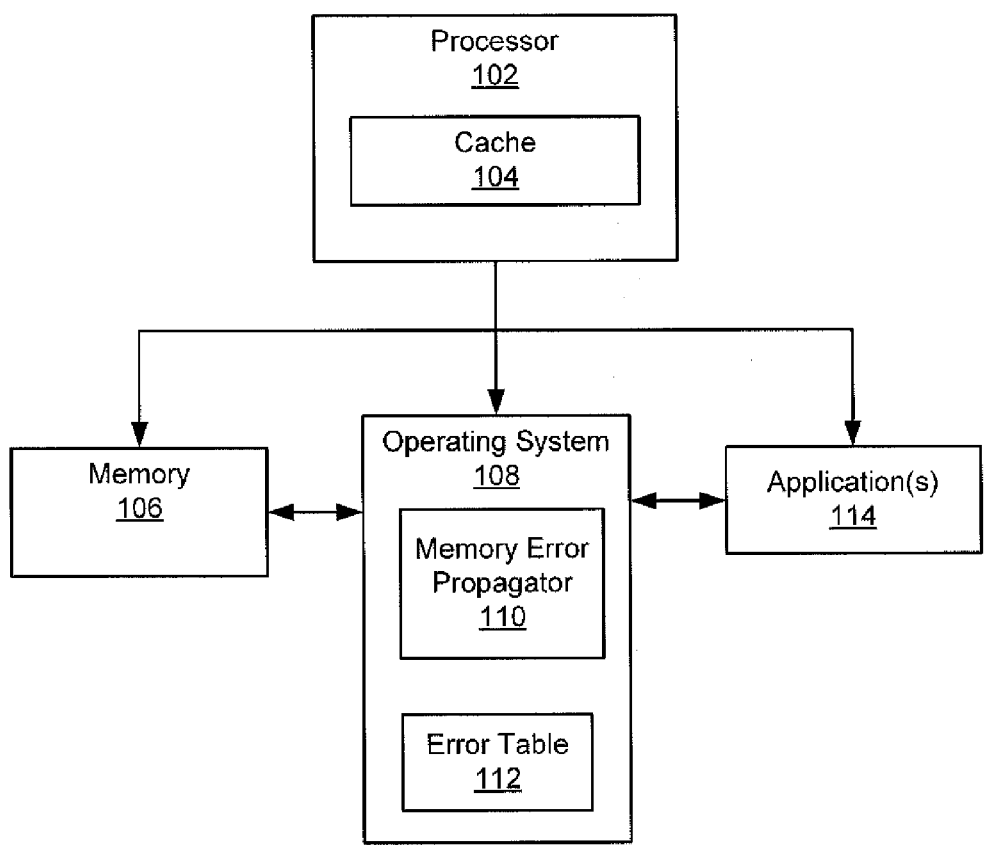
FIG. 1 shows a system in accordance with one or more embodiments of the invention.

Specific embodiments of the invention will now be described in detail with reference to the accompanying figures. Like elements in the various figures are denoted by like reference numerals for consistency.

In the following description of FIGS. 1-7, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

In general, embodiments of the invention relate to a method and system for managing a corrupted memory block. More specifically, embodiments of the invention relate to migrating, once an uncorrectable error (UE) is detected, cache lines from a corrupted memory block to an uncorrupted memory block. In one or more embodiments of the invention, for any cache lines that include an UE, an artificial error is generated and stored in the uncorrupted memory block rather than copying the UE. After the migration, the corrupted memory block is retired in accordance with one or more embodiments of the invention. Embodiments of the invention further relate to replacing an artificial error with error-free data when a requesting process requests access to the cache line that includes the artificial error.

FIG. 1 shows a system in accordance with one or more embodiments of the invention. As shown in FIG. 1, the system includes, a processor (102), memory (106), an operating system (108), and one or more applications (114). Each component is described below.

In one or more embodiments of the invention, the processor (102) may be an integrated circuit for processing instructions.

For example, the processor (102) may be one or more cores, or micro-cores of a processor. In order to successfully execute instructions, the processor (102) frequently accesses (e.g., reads and/or writes) one or more memory addresses in memory (106).

In one or more embodiments of the invention, memory (106) may correspond to random access memory (RAM), dynamic random access memory (DRAM), or any physical memory. In order to expedite execution of the instructions by the processor, the contents of some memory addresses may be locally stored in caches (104), which have faster access times than memory (106). If a cache (104) does not include contents of a required memory address, or if the contents of the memory address is not stored in the cache, a cache miss occurs.

In one or more embodiments of the invention, one or more applications (114) are software programs or processes that are configured to issue requests to the processor (102) to complete a task. For example, an application may request contents of a virtual memory address triggering the processor (102) to access the cache (104) or memory (106) if a cache miss occurs. As another example, an application may request the processor to store contents to memory or a cache. The invention is not limited to an application, rather any requesting process that issues requests to the processor may be used without departing from the invention. In one or more embodiments of the invention, an application includes functionality to communicate to the operating system (108) about whether data requested by the application is accessible elsewhere in memory.

In one or more embodiments of the invention, the operating system (108) is software that manages hardware (e.g., resource allocation) and/or applications (114) of a computing device (not shown). For example, the computing device may be a laptop computer, desktop computer, or any other type of computing device or devices that includes at least the minimum processing power, memory, and input and output device(s) to perform one or more embodiments of the invention. The operating system (108) includes functionality to catch any traps triggered by an application during access of a memory location. The operating system includes a memory error propagator (110) and an error table (112).

In one or more embodiments of the invention, the error table (112) is a data structure (e.g., hash table, array, linked list, etc.) that is configured to store information about errors related to memory (106) that the operating system has observed. A memory error may include, but is not limited to, errors in a single bit or multiple bits (e.g., one or more bit flips) during transmission (e.g., read, write, etc.) of contents of memory. Memory (106) includes a built-in error-correcting code (ECC) mechanism, where an ECC corresponds to extra bits that are added to contents of memory during transmission to detect and potentially correct some memory errors. Other memory errors may be detectable, but are not correctable using ECC and are referred to as uncorrectable errors (UEs). For example, electrical or magnetic interference in the system may result in a bit flip (i.e. 1 becomes 0 or 0 becomes 1). Because of built-in redundancy via ECC, a single bit flip is correctable, however, multiple bit flips may be detected by ECC, but may not be correctable (i.e., the error is an UE). Another example of an UE is a defective element of the hardware associated with physical memory such as the phase lock loop chip on a dual in-line memory module (DIMM), where the DIMM is a memory board on which memory (e.g., DRAM) is packaged.

In one or more embodiments of the invention, the operating system includes functionality to modify an ECC to generate an artificial error. In one or more embodiments of the invention, an artificial error is generated in a particular memory location to signal that a particular location in memory should be treated as if it has a UE. (see e.g., FIGS. 3-4). In one or more embodiments of the invention, information about artificial errors is also stored in the error table (112). For example, if a trap due to an artificial error occurs when an application requests a memory location, the operating system may recognize that the error is an artificial error in the error table to avoid migration of the memory error (see e.g., FIG. 4).

In one or more embodiments of the invention, the memory error propagator (110) may be a software feature of the operating system (108). The memory error propagator includes functionality to migrate a memory block in memory that includes an UE to a new memory block in memory to preserve cache lines without UEs in a manner consistent with FIG. 3-5 described below. The memory error propagator includes further functionality to generate an artificial error and store the artificial error at the location of any UEs in the new memory block in a manner consistent with FIG. 4 described below. Further details of memory blocks are discussed below in FIG. 2. Once an application traps on a cache line that includes an artificial error, the memory error propagator may include functionality to replace the artificial error with error-free data in a manner consistent with FIG. 5 described below.

Although FIG. 1 shows a cache (104), in one or more embodiments of the invention, a cache hierarchy exists where contents of memory addresses from memory (106) are stored first in one or more L3 caches then one or more L2 caches followed by one or more L1 caches (not shown). Further, in one or more embodiments of the invention, the system includes a translation lookaside buffer (TLB) (not shown), which is a cache whose entries store mappings of virtual or logical memory addresses to physical memory addresses. Those skilled in the art will appreciate that the invention is not limited to the configuration shown in FIG. 1.

Figure 2:
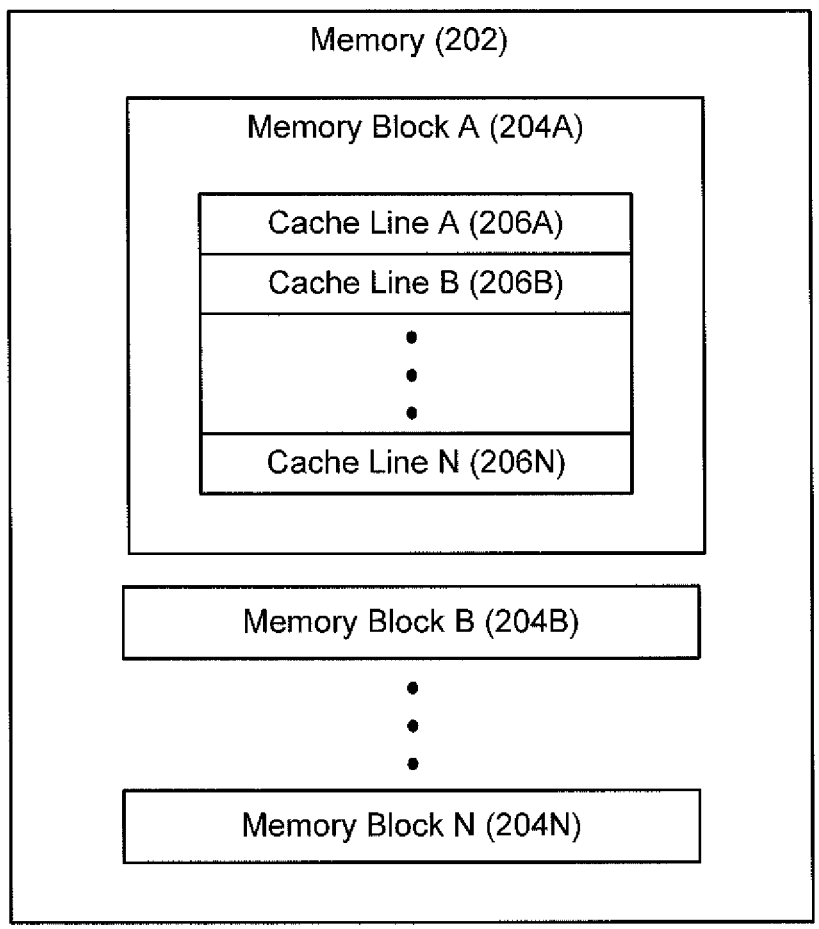
FIG. 2 shows memory in accordance with one or more embodiments of the invention.

FIG. 2 shows memory in accordance with one or more embodiments of the invention. In one or more embodiments of the invention, memory (202) is essentially the same as memory (106) described above in reference to FIG. 1. Memory (202) includes one or more memory blocks (e.g., memory block A (204A), memory block B (204B), memory block N (204N)). In one or more embodiments of the invention, a memory block is the smallest unit of memory (202) that may be migrated.

Each memory block includes one or more cache lines (cache line A (206A), cache line B (206B), cache line N (206N)). In one or more embodiments of the invention, a cache line is the smallest unit of memory that may be copied from memory (202) to a cache. An UE may be included in a cache line in accordance with one or more embodiments of the invention.

Those skilled in the art will appreciate that the invention is not limited to the configuration shown in FIG. 2.

Turning to the flowcharts, while the various steps in the flowchart are presented and described sequentially, one of ordinary skill will appreciate that some or all of the steps may be executed in different orders, may be combined or omitted, and some or all of the steps may be executed in parallel. In one embodiment of the invention, one or more steps shown in FIGS. 3-5 may be performed in parallel with one or more of the other steps shown in FIGS. 3-5.

Figure 3:
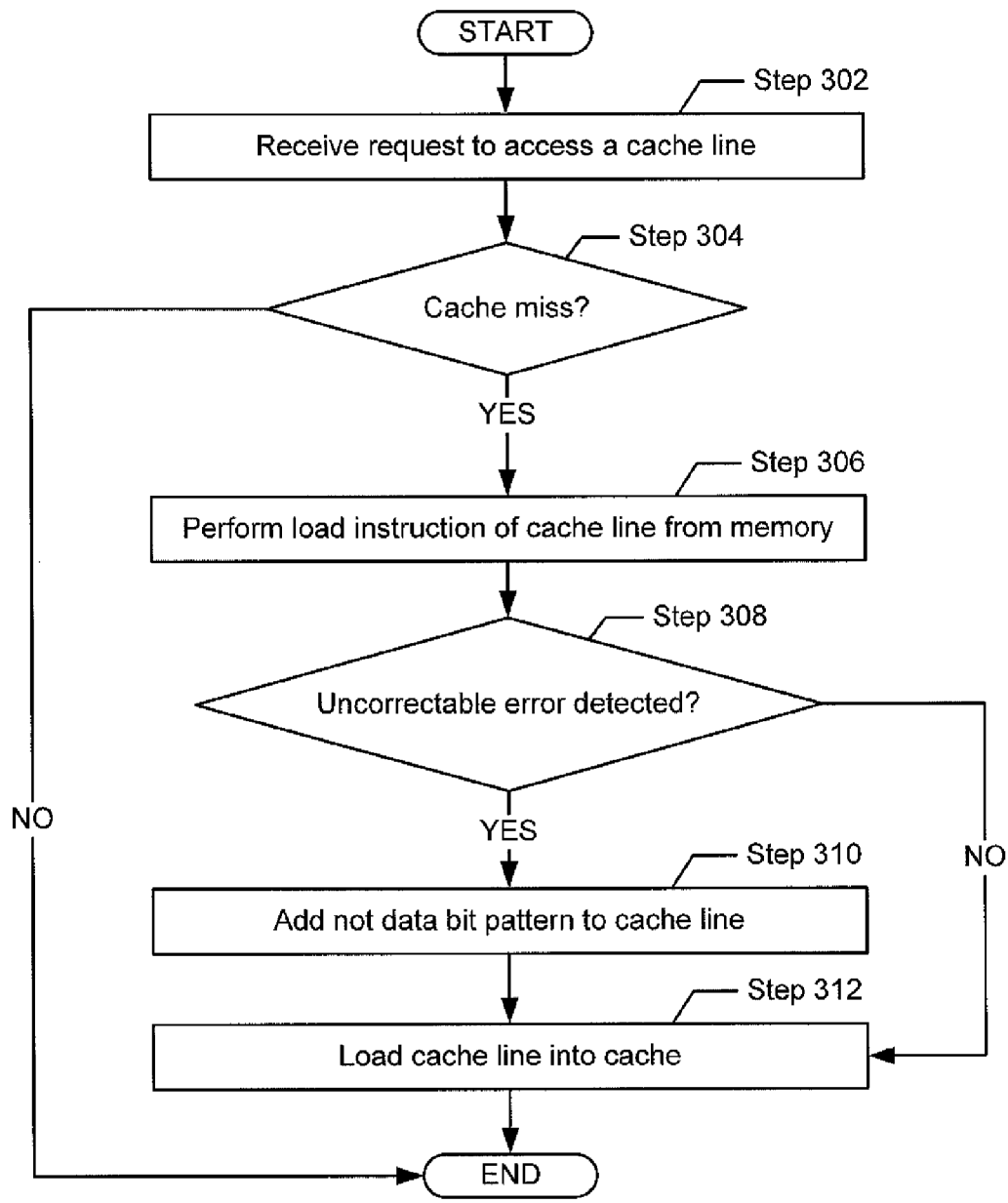
FIG. 3 shows a flowchart for detecting an uncorrectable error in accordance with one or more embodiments of the invention.

Turning to FIG. 3, FIG. 3 shows a flowchart for detecting an uncorrectable error in accordance with one or more embodiments of the invention. In Step 302, a request to access a cache line is received. The request may correspond to a request to read, read/write, and write contents of a cache line.

The request may be received from an application or any requesting process that requests access to one or more cache lines. For a write request and read/write request, the request may include the data to be stored in one or more cache lines or may include a reference to the data to be stored. The request may include a logical address, physical address or any input that provides a mapping to the physical address of the cache line. The request may take any form without departing from the invention.

In Step 304, a determination is made about whether a cache miss occurs during a read request. As described above, a cache miss occurs if contents of a memory address or cache line are not stored in a cache. If a determination is made that a cache miss occurs, the method may proceed to Step 306. In Step 306, because the cache line is not in the cache, a load operation of a cache line of memory is performed to retrieve the cache line from memory.

In Step 308, a determination is made about whether an uncorrectable error (UE) is detected. In one or more embodiments of the invention, an UE is detected using an error correction code (ECC) that is included with the cache line. The extra bits associated with the ECC in the cache line add redundancy (e.g., repeated bits in the cache line, parity bit(s)) to detect whether the cache line includes the uncorrectable error (e.g., multiple bit flips). As described above, ECC may detect, but cannot correct an UE. The UE may be detected using other methods without departing from the invention.

If a determination is made that an uncorrectable error is detected via ECC, the method may proceed to Step 310; otherwise the method may proceed to Step 312. In Step 310, a not data bit pattern may be added to the cache line, where a not data bit pattern is a specific arrangement of bits to indicate the cache line does not contain valid data. In Step 312, the cache line is loaded into a cache. In one or more embodiments of the invention, if a cache line includes a not data bit pattern, a processor may trigger a trap when the processor retrieves the cache line from the cache. The requesting process may be notified that the request was unsuccessful, may attempt to reissue the request in a manner consistent with FIG. 5 (described below), may be killed, or execute any other response after receiving the not data bit pattern. In one or more embodiments of the invention, the operating system catches the trap induced by the processor and initiates the method in FIG. 4.

Figure 4:
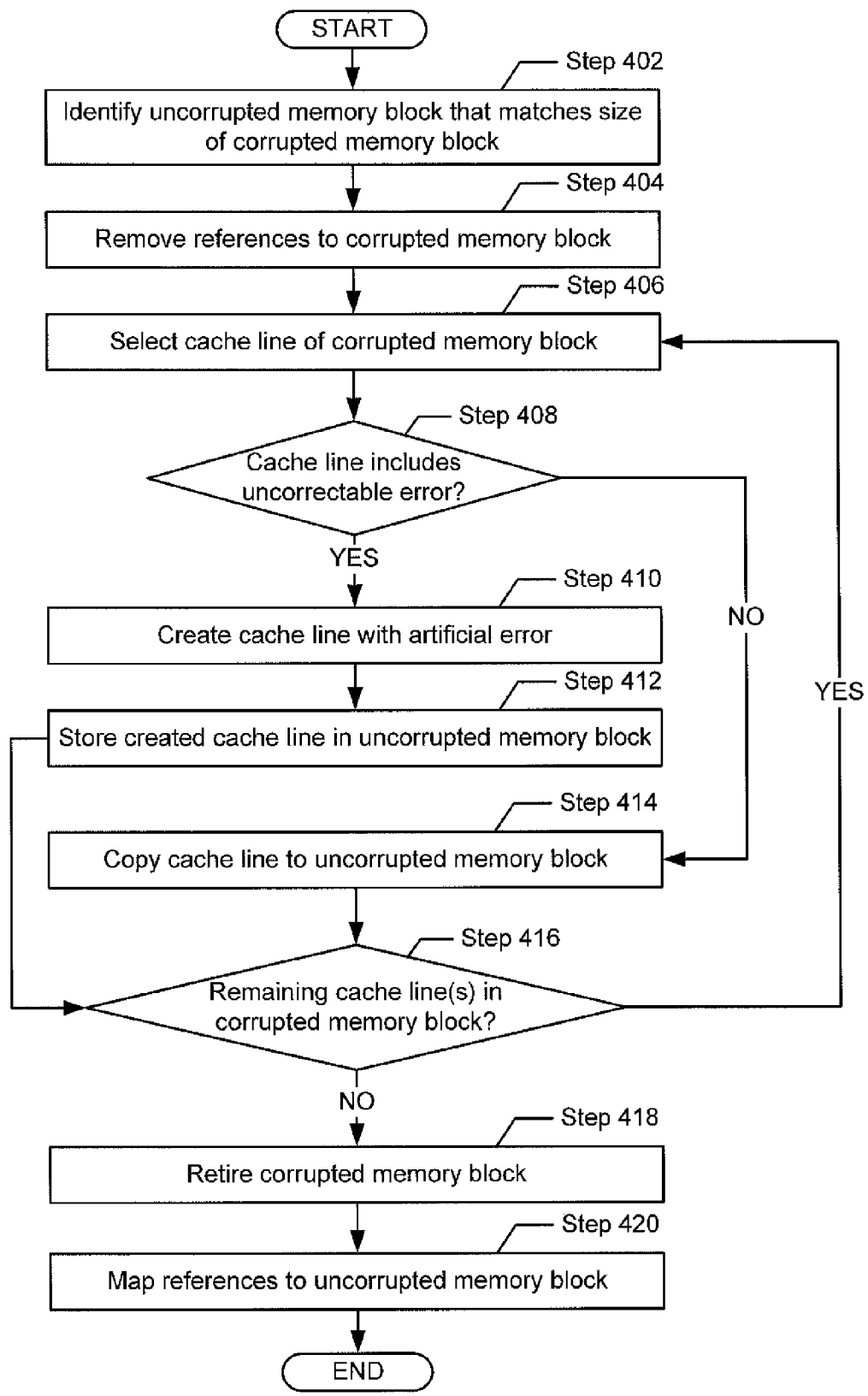
FIG. 4 shows a flowchart for retiring a corrupted memory block in accordance with one or more embodiments of the invention.

FIG. 4 shows a flowchart for retiring a corrupted memory block in accordance with one or more embodiments of the invention. In Step 402, an uncorrupted memory block that matches the size of a corrupted memory block is identified.

In Step 404, references to the corrupted memory block are removed. Thus, any requests to access one or more cache lines in the corrupted memory block may not be able to resolve a physical address from a logical address in the requests. In one or more embodiments of the invention, a translation lookaside buffer (TLB) and/or page table(s) map logical addresses to physical addresses. Inability to resolve a physical address of the corrupted memory block from a logical address may occur because entries in the TLB and/or page table(s) for the corrupted memory block are removed in Step 404. In one or more embodiments of the invention, any requests that include an address of the corrupted memory block may be suspended in a request queue, where the request queue is a list of requests that are suspended during migration to the uncorrupted memory block (described further below).

In Step 406, a cache line of the corrupted memory block is selected. In Step 408, a determination is made about whether the cache line includes an UE. In one or more embodiments of the invention, it may be determined that the cache line includes an UE using an error correction code (ECC) as described above in FIG. 3. If a determination is made that the cache line includes an UE, the method may proceed to Step 410. In Step 410, a cache line with an artificial error is created. Rather than copying the UE to the created cache line, a not data bit pattern or any bit pattern recognizable by the processor as invalid data is included in the cache line in accordance with one or more embodiments of the invention. The ECC of the created cache line is generated by the memory error propagator. The presence of an artificial error associated with a cache line conveys to the processor and/or operating system that an UE was previously at the memory location of the cache line in the corrupted memory block.

In Step 412, the created cache line is stored in the uncorrupted memory block. In other words, the cache line with the artificial error is stored at the same offset in the uncorrupted memory block as the cache line with the UE in the corrupted memory block. In one or more embodiments of the invention, an offset defines a location relative to the starting address of a memory block.

In Step 416, a determination is made about whether there are remaining cache lines in the corrupted memory block. If a determination is made that there are remaining cache lines in the corrupted memory block, the method may return to Step 406 described above. If a determination is made that there are no remaining cache lines in the corrupted memory block, the method may proceed to Step 418. In Step 418, the corrupted memory block may be retired. In one or more embodiments of the invention, it is not possible to read and/or write to a retired corrupted memory block.

In Step 420, references are mapped to the uncorrupted memory block. In one or more embodiments of the invention, logical addresses that previously mapped to physical addresses of the corrupted memory block in the TLB and/or page table(s) are updated to map to physical addresses of the uncorrupted memory block. In other words, the TLB and/or page table(s) include entries to resolve a logical address in a request to a physical address in the uncorrupted memory block. Because references are mapped to the uncorrupted memory block, any requests in the request queue described above may now be responded to or serviced. For example, a read request to a cache line is received after the references to the corrupted memory block are removed in Step 404. The read request is then added to the request queue. Once the references are mapped, the read request in the request queue may be serviced. In other words, the contents of the cache line in the uncorrupted memory block are sent to the requesting process that submitted the read request.

Returning to Step 408, if a determination is made that the cache line does not include an UE, the method may proceed to Step 414. In Step 414, the cache line is copied to the uncorrupted memory block. In one or more embodiments of the invention, the cache line may include error-free data if the cache line does not include an UE. Because the cache line may include error-free data, the contents of the cache line are preserved when copied in Step 414. Further, the cache line is copied to the uncorrupted memory block at the same offset as the cache line in the corrupted memory block. The method may then proceed to Step 416 described above.

Figure 5:
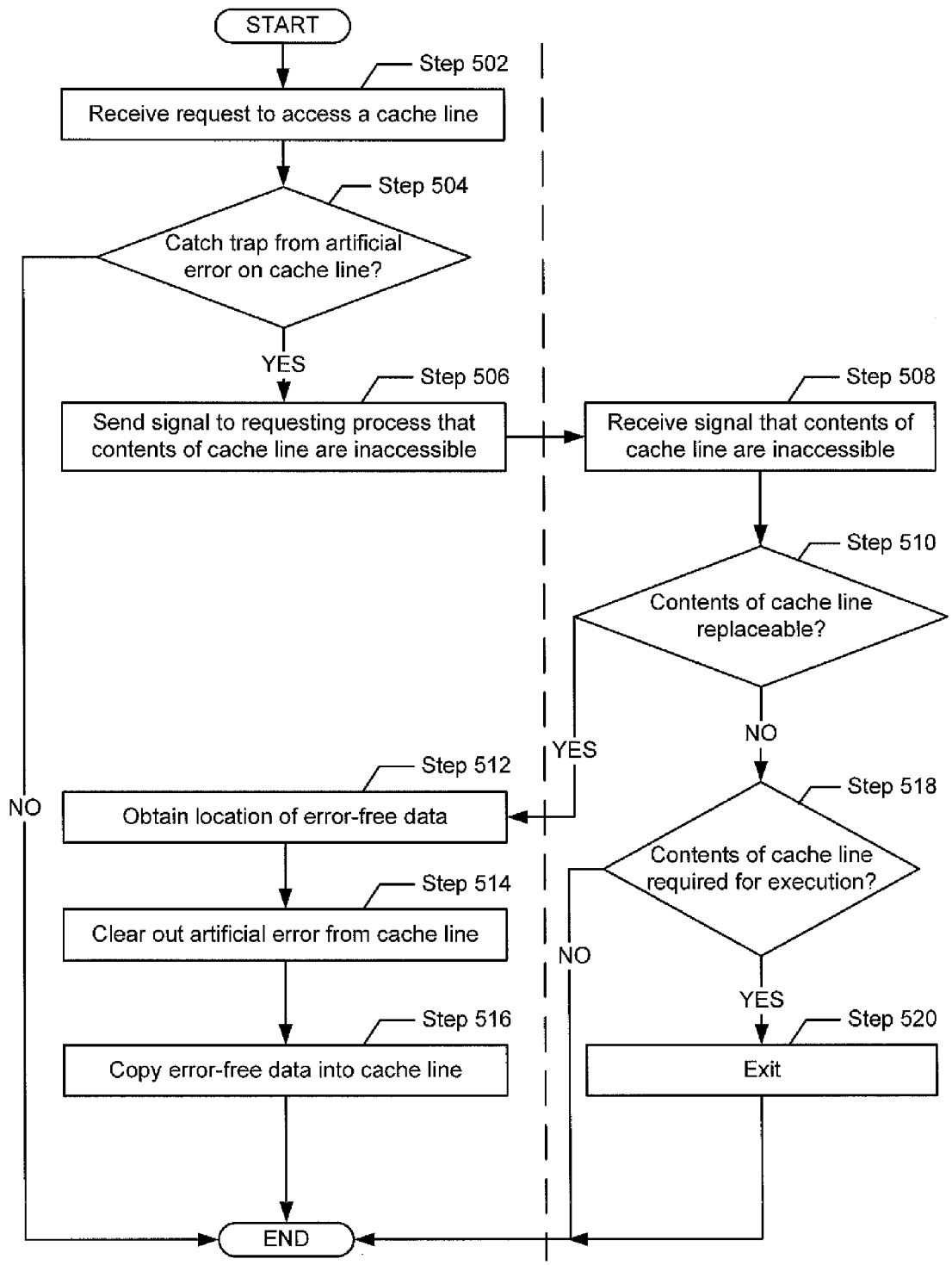
FIG. 5 shows a flowchart for replacing an artificial error with error-free data in accordance with one or more embodiments of the invention.

Turning to FIG. 5, FIG. 5 shows a flowchart for replacing an artificial error with error-free data in accordance with one or more embodiments of the invention. The following steps are performed by the operating system and/or processor, excluding steps 508, 510, 518, and 520. Steps 508, 510, 518, and 520 are performed by the requesting process, not the operating system and/or processor. In Step 502, a request to access a cache line is received. The request may correspond to a read request, a write request, or a read/write request from an application or any requesting process that requests access to one or more cache lines. For a write request and read/write request, the request may include the data to be stored in one or more cache lines or may include a reference to the data to be stored. The request may include a logical address, physical address or any input that provides a mapping to the physical address of the cache line. The request may take any form without departing from the invention.

In Step 504, a determination is made about whether the cache line includes an artificial error. In one or more embodiments of the invention, a requesting process traps if the request in Step 502 is to load a cache line that includes an artificial error. The operating system catches the trap and recognizes the error is an artificial error based on an entry corresponding to the artificial error in the error table in accordance with one or more embodiments of the invention. If a determination is made that a trap from an artificial error on the cache line is caught, the method may proceed to Step 506. In Step 506, a signal is sent to the requesting process that contents of the cache line are inaccessible.

In Step 508, the signal sent by the operating system in Step 506 that the contents of the cache line are inaccessible is received by the requesting process. In one or more embodiments of the invention, the requesting process may include a signal handler to receive the signal from the operating system. In one or more embodiments of the invention, a signal handler is software that is triggered by reception of the signal sent by the operating system. The signal may or may not include the memory location of the cache line that triggered the trap. In one or more embodiments of the invention, the requesting process may perform a query to determine the memory location of the cache line if the memory location is not included in the signal. In one or more embodiments of the invention, the requesting process may continue execution, exit, or execute any error handling after receiving the signal from the operating system because there is no requirement that the requesting process must respond to the operating system to reconstruct the cache line (described below).

In Step 510, a determination is made about whether contents of the cache line are replaceable. In one or more embodiments of the invention, contents of the cache line are replaceable if a copy exists in memory. If a determination is made that contents of the cache line are replaceable, the method may proceed to Step 512; otherwise the method may proceed to Step 518.

In Step 512, a location of error-free data is obtained from the requesting process. In one or more embodiments of the invention, the requesting process includes functionality to send the operating system a logical or physical address of a copy of error-free data in memory to reconstruct contents of the cache line. In Step 514, the artificial error from the cache line is cleared out. Said another way, the artificial error is deleted from the cache line.

In Step 516, error-free data is copied into the cache line. In one or more embodiments of the invention, the memory error propagator may use the location obtained in Step 512 to locate a copy of error-free data in memory to reconstruct the cache line. In one or more embodiments of the invention, if a copy does not exist in memory, the contents of the cache line may be retrieved from disk, or from a network, or from some other input/output device, where access to the disk, network, or other input/output device is slower compared to memory. In one or more embodiments of the invention, the signal handler of the requesting process may reissue the load/read instruction to provide the requesting process with the error-free data that replaced the artificial error.

In one embodiment of the invention, steps 514 and 516 take place atomically from the perspective of the application. In such scenarios, by performing steps 514 and 516 atomically from the perspective of the application, there is not a case in which the operating system has cleared the artificial error (i.e., performed step 514) but has not replaced the cleared artificial error with error-free data (i.e., step 526) and during this interim period the application attempts to access the cleared cache line. In one or more embodiments of the invention, if step 514 and 516 were not performed atomically from the perspective of the application, the application might read invalid data.

In Step 518, if the contents of the cache line are not replaceable, a determination is made by the requesting process about whether contents of the cache line are required for execution. In one or more embodiments of the invention, the requesting process includes functionality to determine whether the contents of the cache line that includes an artificial error are required by the requesting process. For example, if the contents of the cache line are used in a calculation of the requesting process, the contents of the cache line may be required to execute the calculation. In another example, the contents of the cache line may not be required because execution of the requesting process may continue without the contents of the cache line. If a determination is made that contents of the cache line are required for execution, the method may proceed to Step 520; otherwise the requesting process continues execution. In Step 520, the requesting process exits and may indicate a fatal error has occurred.

Returning to Step 510, in another embodiment of the invention, even if a copy of the contents of the cache line does not exist in memory, contents of the cache line may still be replaceable if the error-free data may be derived from data stored by the requesting process and/or generated by executing functions or software of the requesting process. In this case, the thread to determine whether the contents of the cache line are replaceable may be suspended. The thread that caught the trap or another thread may derive or generate the error-free data. Once the error-free data is available, the thread to determine whether the contents of the cache line are replaceable may be resumed. The method may then proceed to Step 514 described above. For example, suppose the error-free data for the cache line corresponds to a result of a calculation. The requesting process may store an intermediate result that may be used to recalculate the error-free data to reconstruct the cache line. As another example, suppose the intermediate result in the previous example does not exist. The requesting process may then re-run the entire calculation software of the requesting process to redo the calculation to obtain the error-free data to reconstruct the cache line.

Figure 6A:
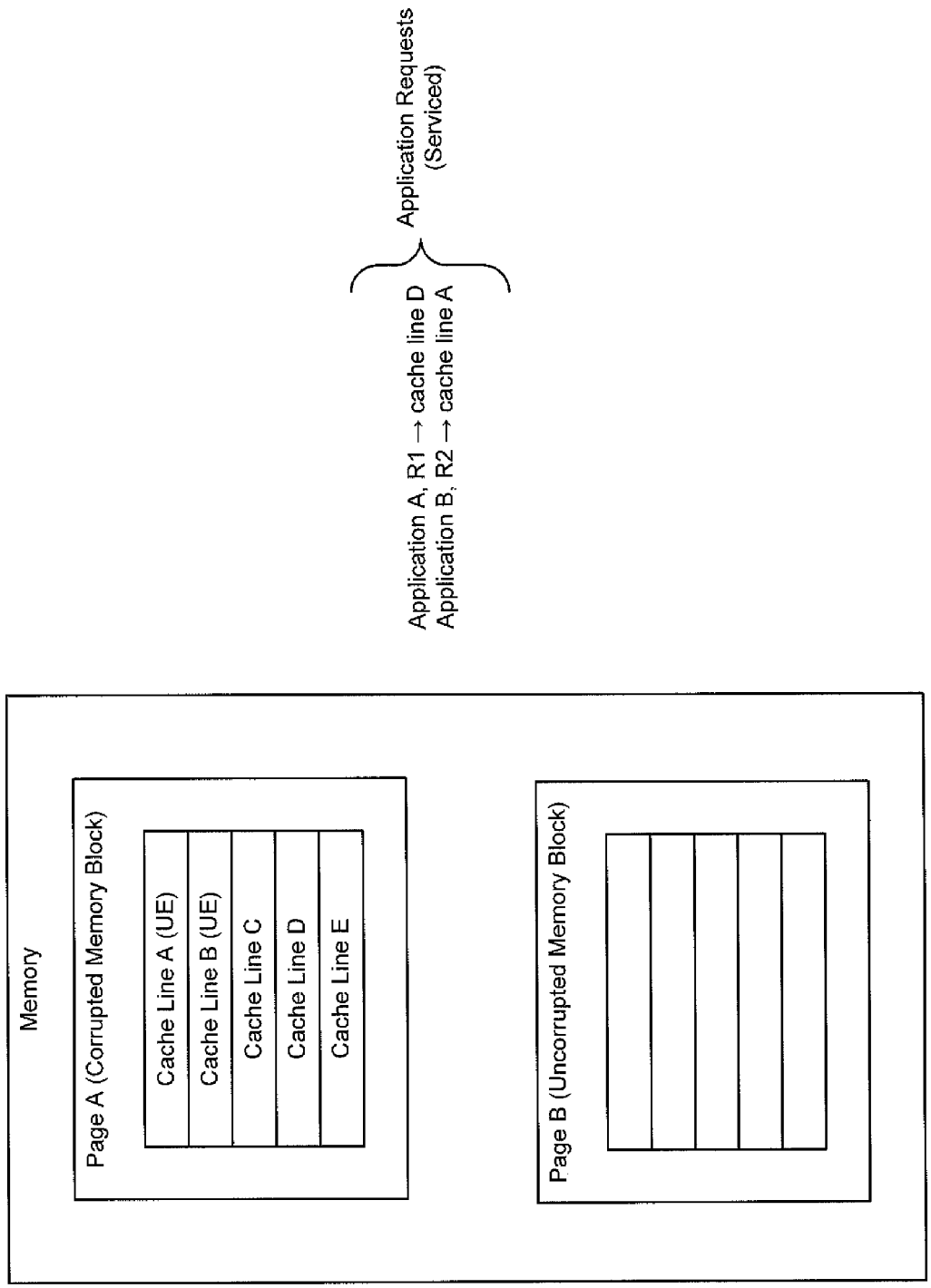
FIGS. 6A-6C show an example in accordance with one or more embodiments of the invention.
Figure 6B:
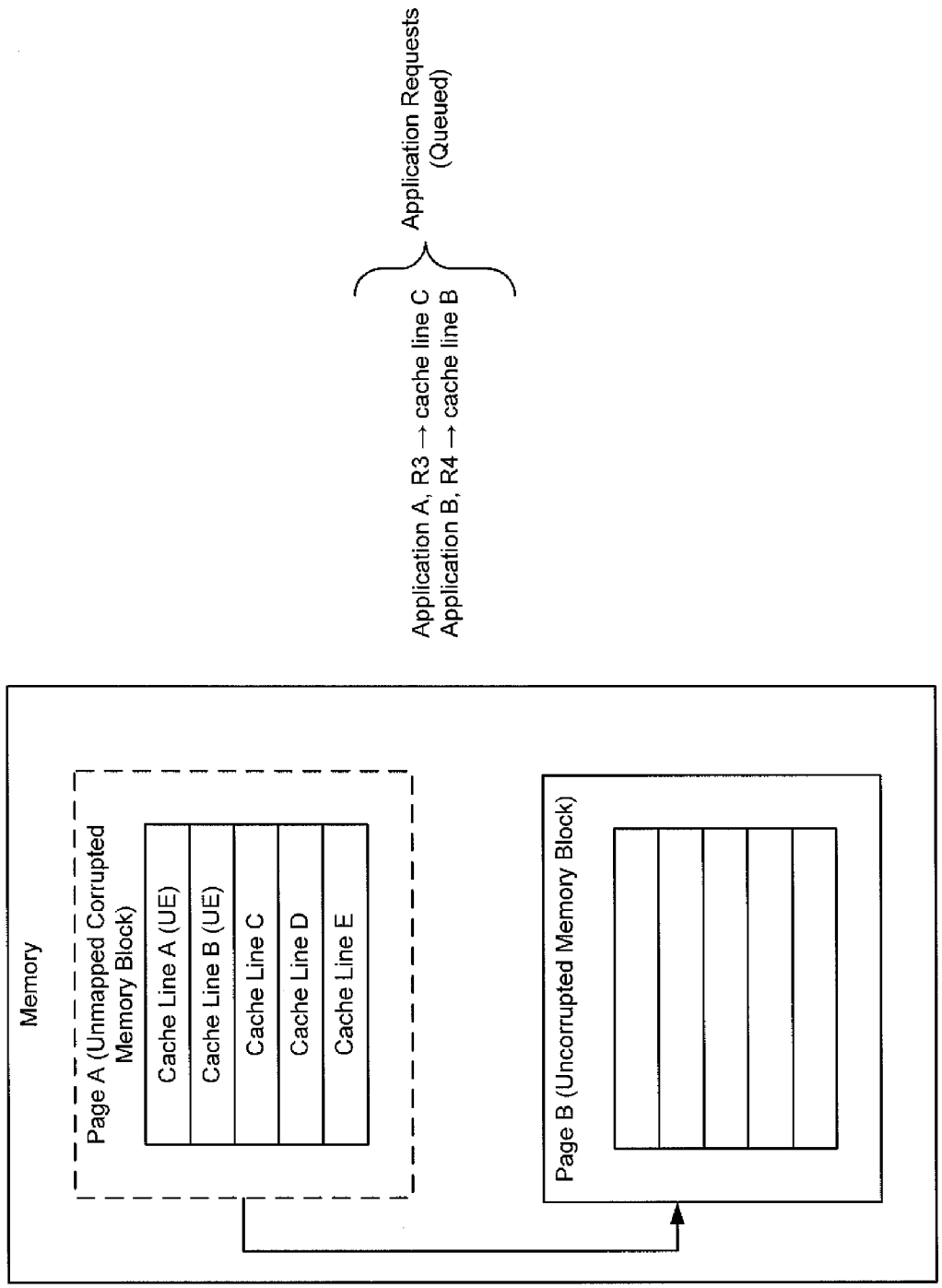
Figure 6C:
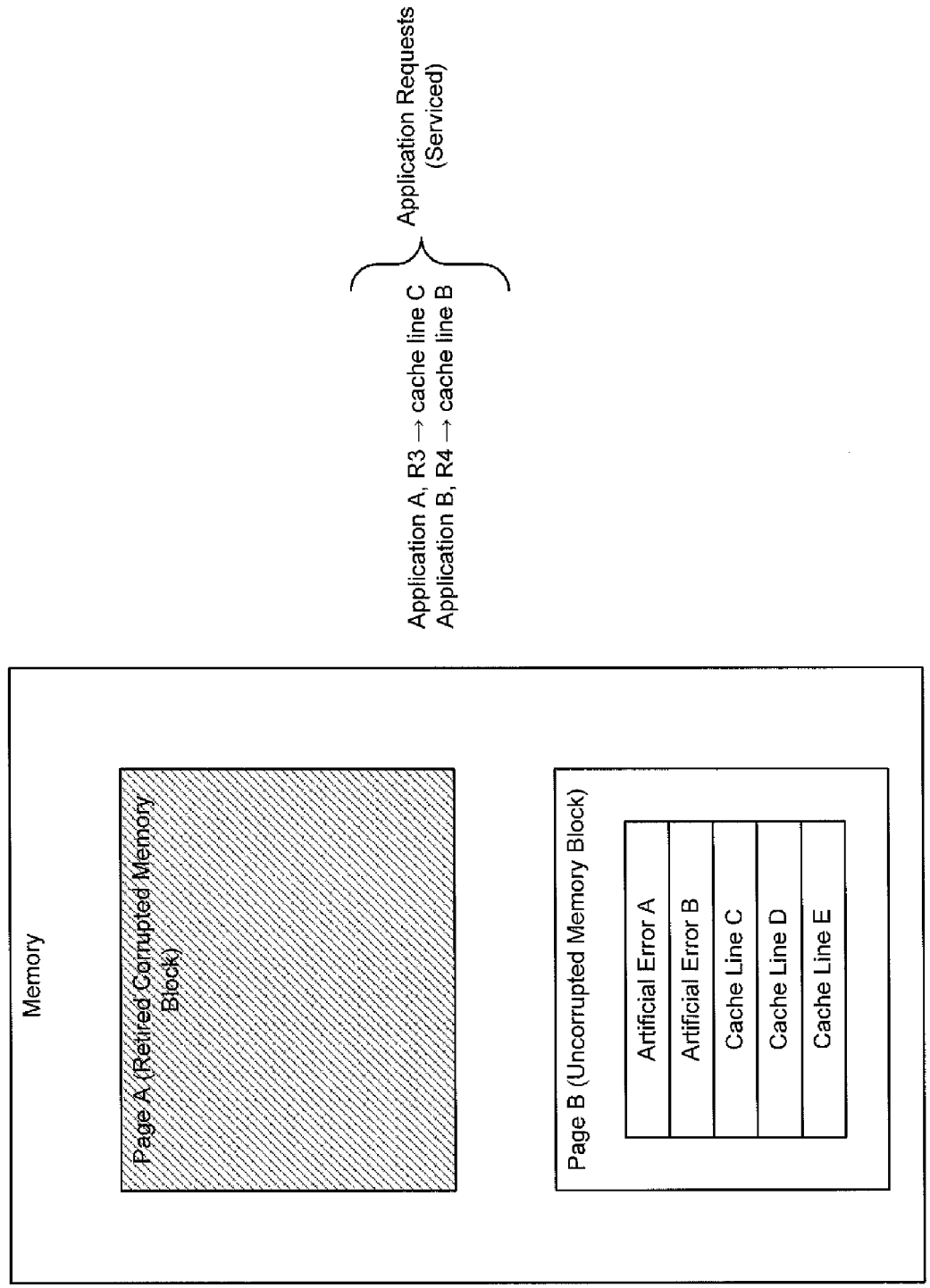

FIGS. 6A-6C show an example in accordance with one or more embodiments of the invention. The example is not intended to limit the scope of the invention.

Referring to FIG. 6A, consider a scenario in which a page A in memory includes cache line A, cache line B, cache line C, cache line D, and cache line E. Cache line A and cache line B each include an uncorrectable error (UE). Because page A includes one or more UEs, page A is a corrupted memory block.

Request R1 is received from Application A to read data on cache line D. In response to request R1, the contents of cache line D are sent to application A. Request R2 is then received from application B requesting access to cache line A. An error correcting code (ECC) detects the UE in cache line A and responds to the request with a not data bit pattern in a manner consistent with FIG. 3 described above.

Referring to FIG. 6B, consider a scenario in which the detection of the UE in cache line A of page A in FIG. 6A triggers migration of the cache lines in page A to page B in a manner consistent with FIG. 4 described above. Page B is the same size as page A and page B is an uncorrupted memory block. During migration of each cache line in page A, analysis is performed to determine whether other cache lines in page A include an UE. Further, references to the cache lines in page A are unmapped in the translation lookaside buffer (TLB) and any page tables storing logical addresses that map to physical addresses in page A. Therefore, page A is now an unmapped corrupt memory block.

For cache line A, rather than migrating the UE to page B, cache line A in page B is updated to include a not data bit pattern and an artificial error as the ECC. During analysis of cache line B, an UE in cache line B is found. Therefore, similarly to cache line A, cache line B in page B is updated to include a not data bit pattern and an artificial error as the ECC for storage in page B. The remaining cache lines, cache line C, cache line D, and cache line E have error-free data. The error-free cache lines are therefore preserved during migration to page B.

Continuing with the example in FIG. 6B, during the migration, request R3 is received from application A to read data on cache line C. Because page A is an unmapped corrupted memory block, the request is stored in a request queue, which queues any requests to cache lines in page A until the migration is complete or until logical addresses are mapped to physical addresses in page B via the TLB and any page tables. Request R4 is received from application B to access cache line B. Similarly to request R3, request R4 is suspended and added to the request queue.

Referring to FIG. 6C, consider a scenario in which page A is retired following the migration described in FIG. 6B. Page A or the retired corrupted memory block may not be accessed even if a physical address of page A is known as page A is retired. Once the migration is complete, references to cache lines A to E in the TLB and any page tables are updated to map logical addresses to physical addresses in page B. As described above in FIG. 6B, each of the cache lines from page A are stored in page B at the same offset as they were in page A. As shown in FIG. 6C, the UE in cache line A is replaced with an artificial error. Similarly, the UE in cache line B is replaced with an artificial error.

As described in FIG. 6B, request R3 from application A and request R4 from application B are queued in the request queue during the migration. Now that references to cache lines A to cache line E are updated, requests R3 and R4 may be serviced. In other words, R3 may access cache line C and R4 may access cache line B. When R3 accesses cache line C, the error-free data in cache line C is sent to application A. However, when R4 accesses cache line B, a trap due to the artificial error occurs in a manner consistent with FIG. 5 described above. The operating system catches the trap and sends a signal to application B that R4 is not serviceable because cache line B is inaccessible. Application B then sends a location of a copy of the contents of cache line B to the operating system. The memory error propagator then retrieves the copy of the contents of cache line B in memory. The copy of the contents of cache line B is error-free data that replaces the artificial error in cache line B.

Embodiments of the invention enable a graceful response to a trap triggered by an attempt to load a memory location (e.g., cache line) that includes an uncorrectable error (UE). The graceful response enables preservation of cache lines that do not include an UE in a memory block. Embodiments of the invention enable retirement of a corrupted memory block after migration from a corrupted memory block to an uncorrupted memory block. In this manner, the graceful response does not require waiting for the memory block to be unused to retire the memory block. As a result, further propagation of any UEs may be prevented more quickly. Since the presence of one UE in a memory block may indicate that more UEs will likely develop in that memory block over time, quick relocation of the memory block reduces the likelihood that other regions in that memory block will become inaccessible. Finally, embodiments of the invention enable safe replacement of an artificial error on a cache line with error-free data based on accessibility and reproducibility of the contents of the cache line by a requesting process.

Figure 7:
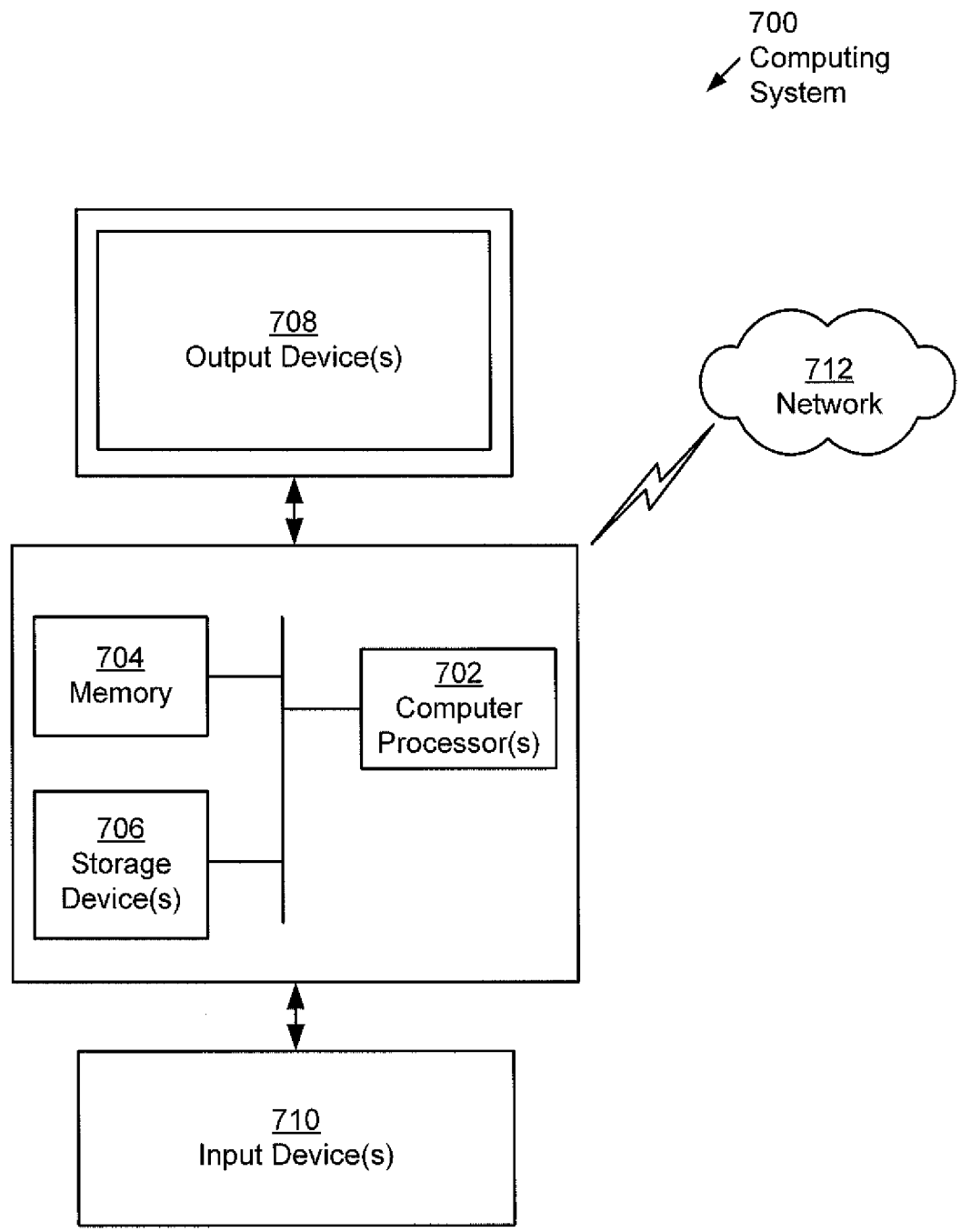
FIG. 7 shows a computer system in accordance with one or more embodiments of the invention.

Embodiments of the invention may be implemented on virtually any type of computing system regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments of the invention. For example, as shown in FIG. 7, the computing system (700) may include one or more computer processor(s) (702), associated memory (704) (e.g., random access memory (RAM), cache memory, flash memory, etc.), one or more storage device(s) (706) (e.g., a hard disk, an optical drive such as a compact disk (CD) drive or digital versatile disk (DVD) drive, a flash memory stick, etc.), and numerous other elements and functionalities. The computer processor(s) (702) may be an integrated circuit for processing instructions. For example, the computer processor (s) may be one or more cores, or micro-cores of a processor. The computing system (700) may also include one or more input device(s) (710), such as a touchscreen, keyboard, mouse, microphone, touchpad, electronic pen, or any other type of input device. Further, the computing system (700) may include one or more output device(s) (708), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (700) may be connected to a network (714) (e.g., a local area network (LAN), a wide area network (WAN) such as the Internet, mobile network, or any other type of network) via a network interface connection (not shown). The input and output device(s) may be locally or remotely (e.g., via the network (712)) connected to the computer processor(s) (702), memory (704), and storage device(s) (706). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system (700) may be located at a remote location and connected to the other elements over a network (714). Further, embodiments of the invention may be implemented on a distributed system having a plurality of nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or microcore of a computer processor with shared memory and/or resources.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for managing a corrupted memory block, comprising:
    detecting the corrupted memory block comprising a plurality of cache lines;
    removing, after detecting the corrupted memory block, a plurality of references to the corrupted memory block;
    identifying, after detecting the corrupted memory block, an uncorrupted memory block;
    analyzing each cache line of the plurality of cache lines;
    determining, while analyzing each cache line, a first cache line of the plurality of cache lines comprises an uncorrectable error;
    creating, based on determining the first cache line comprises the uncorrectable error, a second cache line comprising an artificial error; and
    migrating the second cache line and each of the plurality of cache lines excluding the first cache line to the uncorrupted memory block, wherein a layout of the corrupted memory block is maintained by at least:
        obtaining an offset for each cache line in the plurality of cache lines in the corrupted memory block; and
        storing, based on the offset, each cache line in the uncorrupted memory block.

2. The method of claim 1, further comprising:
    receiving, from a requesting process, a request to access the second cache line;
    determining that the second cache line comprises an artificial error;
    notifying the requesting process that contents of the second cache line is inaccessible;
    in response to the notifying, receiving a location of error-free data, wherein the location is provided by the requesting process;
    removing the artificial error from the second cache line; and
    storing the error-free data from the location into the second cache line.

3. The method of claim 1, further comprising:
    mapping, after migrating, the plurality of references to the uncorrupted memory block.

4. The method of claim 3, further comprising:
    prior to mapping, retiring, after migrating, the corrupted memory block.

5. The method of claim 3, further comprising:
    receiving, after removing the plurality of references, a plurality of requests to access the corrupted memory block;
    queuing, after receiving the plurality of requests, the plurality of requests in a request queue; and
    processing, after mapping the plurality of references, each request of the plurality of requests in the request queue.

6. The method of claim 3, wherein the plurality of references comprise a plurality of entries in at least one selected from a group consisting of a translation lookaside buffer (TLB) and a page table.

7. The method of claim 1, wherein the uncorrupted memory block is the same size as the corrupted memory block.

8. The method of claim 1, wherein the corrupted memory block is a page in memory.

9. The method of claim 1, wherein the corrupted memory block is detected using an error correction code (ECC).

10. A non-transitory computer readable medium comprising instructions, which when executed by a processor perform a method, the method comprising:
    detecting a corrupted memory block comprising a plurality of cache lines;
    removing, after detecting the corrupted memory block, a plurality of references to the corrupted memory block;
    identifying, after detecting the corrupted memory block, an uncorrupted memory block;
    analyzing each cache line of the plurality of cache lines;
    determining, while analyzing each cache line, a first cache line of the plurality of cache lines comprises an uncorrectable error;
    creating, based on determining the first cache line comprises the uncorrectable error, a second cache line comprising an artificial error; and
    migrating the second cache line and each of the plurality of cache lines excluding the first cache line to the uncorrupted memory block, wherein a layout of the corrupted memory block is maintained by at least:
        obtaining an offset for each cache line in the plurality of cache lines in the corrupted memory block; and
        storing, based on the offset, each cache line in the uncorrupted memory block.

11. The non-transitory computer readable medium of claim 10, further comprising:
    retiring, after migrating, the corrupted memory block; and
    mapping, after migrating, the plurality of references to the uncorrupted memory block.

12. The non-transitory computer readable medium of claim 11, further comprising:
    receiving, after removing the plurality of references, a plurality of requests to access the corrupted memory block;
    queuing, after receiving the plurality of requests, the plurality of requests in a request queue; and
    processing, after mapping the plurality of references, each request of the plurality of requests in the request queue.

13. The non-transitory computer readable medium of claim 11, wherein the plurality of references comprise a plurality of entries in at least one selected from a group consisting of a translation lookaside buffer (TLB) and a page table.

14. The non-transitory computer readable medium of claim 10, wherein the uncorrupted memory block is the same size as the corrupted memory block and wherein the corrupted memory block is a page in memory.

15. The non-transitory computer readable medium of claim 10, wherein the corrupted memory block is detected using an error correction code (ECC).

16. A system for managing a corrupted memory block, comprising:
    a plurality of memory blocks comprising the corrupted memory block and an uncorrupted memory block;
    a processor; and
    a memory error propagator, which when executed by the processor, performs a method, the method comprising:

detecting the corrupted memory block comprising a plurality of cache lines;
removing, after detecting the corrupted memory block, a plurality of references to the corrupted memory block;
identifying, after detecting the corrupted memory block, the uncorrupted memory block;
analyzing each cache line of the plurality of cache lines;
determining, while analyzing each cache line, a first cache line of the plurality of cache lines comprises an uncorrectable error;
creating, based on determining the first cache line comprises the uncorrectable error, a second cache line comprising an artificial error; and
migrating the second cache line and each of the plurality of cache lines excluding the first cache line to the uncorrupted memory block, wherein a layout of the corrupted memory block is maintained by at least:
obtaining an offset for each cache line in the plurality of cache lines in the corrupted memory block; and
storing, based on the offset, each cache line in the uncorrupted memory block.

17. The system of claim 16, wherein a memory block of the plurality of memory blocks is a page in memory and wherein the uncorrupted memory block is the same size as the corrupted memory block.

18. The system of claim 16, wherein the memory error propagator is further configured to:
map, after migrating, the plurality of references to the uncorrupted memory block.

* * * * *